United States Patent [19]
Koen

[11] Patent Number: 5,880,618
[45] Date of Patent: Mar. 9, 1999

[54] CMOS DIFFERENTIAL VOLTAGE CONTROLLED LOGARITHMIC ATTENUATOR AND METHOD

[75] Inventor: Myron J. Koen, Tucson, Ariz.

[73] Assignee: Burr-Brown Corporation, Tucson, Ariz.

[21] Appl. No.: 942,838

[22] Filed: Oct. 2, 1997

[51] Int. Cl.[6] .................................................. H03G 11/08
[52] U.S. Cl. ............................................ 327/351; 327/350
[58] Field of Search .................... 327/346, 350, 327/351, 352

[56] References Cited

U.S. PATENT DOCUMENTS

| | | | |
|---|---|---|---|
| 3,539,831 | 11/1970 | Gilbert | 307/235 |
| 3,590,366 | 6/1971 | Vaughn | 323/354 |
| 4,475,169 | 10/1984 | Gilbert | 364/817 |
| 4,476,538 | 10/1984 | Gilbert | 364/817 |
| 4,500,845 | 2/1985 | Ehni | 330/86 |
| 4,521,764 | 6/1985 | Burton | 340/347 |
| 5,077,541 | 12/1991 | Gilbert | 330/284 |
| 5,432,478 | 7/1995 | Gilbert | 330/284 |
| 5,523,712 | 6/1996 | Miyabe et al. | 327/350 |

FOREIGN PATENT DOCUMENTS 8203979  10/1982  Netherlands ................. H03H 7/25

*Primary Examiner*—Toan Tran
*Attorney, Agent, or Firm*—Cahill, Sutton & Thomas P.L.C.

[57] ABSTRACT

A logarithmic attenuator circuit includes a resistive attenuator in which the series resistors are P-channel MOSFETs with gate electrodes connected to $V_{DD}$ and the parallel resistors are P-channel MOSFETs which also function as switches. A control circuit (8B) produces a plurality of successive control signals (V1,2 . . . 10) on the gate electrodes of the successive MOSFETs which functions as switches in response to a gain control signal ($V_{GC}$)

13 Claims, 6 Drawing Sheets

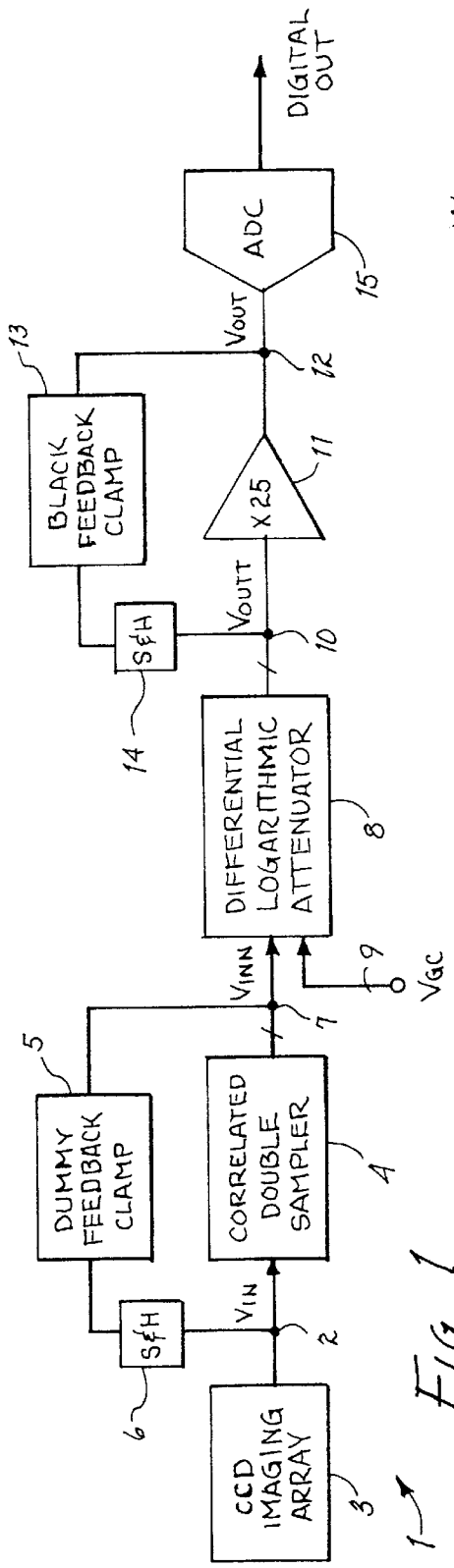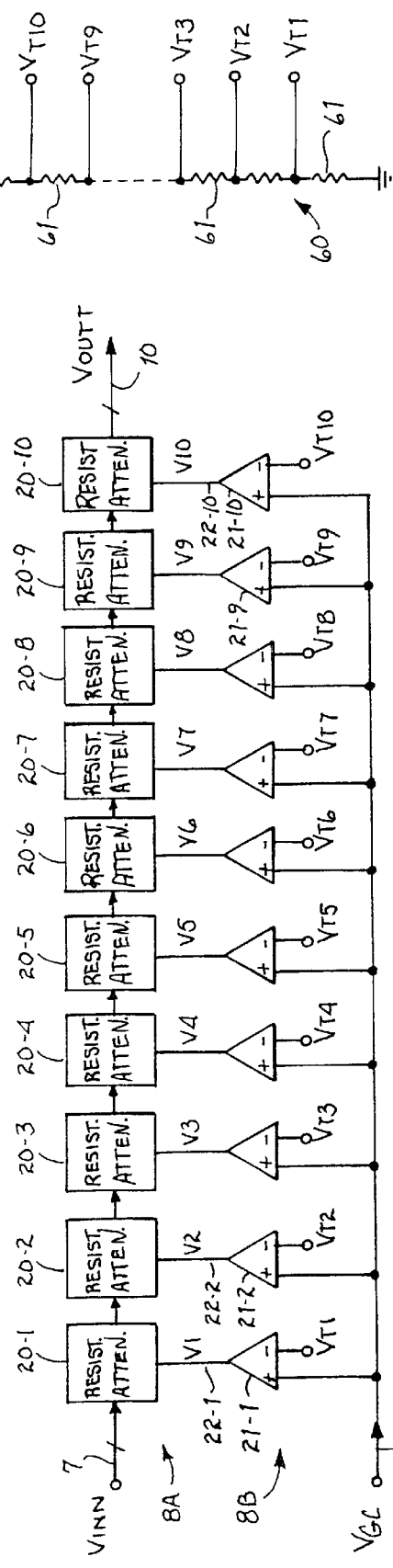

CMOS DIFFERENTIAL VOLTAGE CONTROLLED LOGARITHMIC ATTENUATOR AND METHOD

BACKGROUND OF THE INVENTION

The invention relates to variable gain logarithmic attenuators/amplifiers, and more particularly to such devices which are more precisely linear than those of the prior art, and still more particularly to such devices which are more easily implemented using CMOS technology than the devices of the prior art.

The closest prior art is set forth in U.S. Pat. No. 5,077,541 entitled "VARIABLE-GAIN AMPLIFIER CONTROLLED BY AN ANALOG SIGNAL AND HAVING A LARGE DYNAMIC RANGE", issued Dec. 31, 1991 and U.S. Pat. No. 5,432,478 entitled "LINEAR INTERPOLATION CIRCUIT", issued Jul. 11, 1995, both by Gilbert, and both assigned to Analog Devices, Inc.

The Gilbert '541 patent discloses a variable gain amplifier including, as a feedback network, a ladder attenuator circuit 22 having a number of "tap" points which are applied as inputs to the + inputs of ten "$g_m$ stages" 36, the outputs of which are connected to a differential amplifier 28 to produce an output signal of the variable gain amplifier. A "swept" control signal is applied between conductors 32 and 34 of a gain control circuit 30 that includes ten transistors 40, nine base resistors $R_S$, and eight constant current sources I. The gain control circuit, in effect, includes ten "segments", each of which supplies a controllable bias current to a corresponding $g_m$ stage. The gain range of the variable gain amplifier can be viewed as being subdivided into successive segments, each segment having its own $g_m$ stage connected to a corresponding node of the attenuation ladder. Applying the $V_{CONTROL}$ voltage to the gain control circuit 30 activates each segment amplifier in turn, by increasing and then decreasing the transconductance of that stage. The increasing and decreasing and transconductance occurs in the adjacent $g_m$ stages in succession in an overlapping fashion to provide a smooth reduction in overall gain. The effective "tap" point of the attenuator is said to be continuously "interpolated" between the nodes of the latter circuit by the gain control circuit 30.

Gilbert's '478 patent refers to the logarithmic attenuator of his earlier '541 patent as producing a plurality of overlapping, exponentially varying currents as the control signal is swept through its entire range. The non-linearities in the current waveforms produce a non-linear gain in the $g_m$ stags as a function of the control signal. Gilbert acknowledges that in many applications, however, a more linear current waveform than obtained in his earlier circuit is required. Gilbert proposed to solve the linearity problems which he attributes to the interpolation circuit 30 in his '541 patent by providing a significantly different interpolation circuit 16 which included five sections or "legs" and four pairs of parallel-connected pairs of shunting diodes connected between such legs. For example, one leg includes constant current source I1 and diode D1 connected in series, the adjacent leg includes current source I2 and diode D2 connected in series, and the shunting diodes include parallel-connected diodes D21 and D12 connected between conductors 36 and 38. Conductor 36 also is connected to an output transistor Q1 which produces a bias current $I_A$ that, in effect, "enables" a corresponding transconductance amplifier 14A and controls the transconductance thereof. See FIG. 1 of the '478 patent, in which transconductance amplifier 14A is similar to the first transconductance amplifier 36 in FIG. 1 of the '541 patent. The control nodes 28 and 30 of the interpolation circuit 16 of the '478 patent are connected to current sources 32 and 34, respectively, which "demand" complementary currents through the diodes D1–D5, and hence the output currents $I_{A,B \ldots E}$, to be piece-wise linear functions of the control signal supplied between control nodes 28 and 30 as the control signal is "swept" through its full range. FIGS. 5A–E and 6 of the '478 patent illustrate the piece-wise linear behavior of interpolation circuit 16 which constitutes the improvement over the less linear circuitry of Gilbert's '541 patent.

While the logarithmic amplifiers disclosed in the Gilbert '541 and '478 patents operate acceptably for implementation in bipolar integrated circuit structures, they are not as well suited for implementation by means of CMOS integrated circuit structures. One reason for this is that the logarithmic attenuators disclosed in the Gilbert '541 and '478 patents are located in the feedback loop of an operational amplifier, and if the circuits disclosed by Gilbert were to be implemented in CMOS technology, the bandwidth would be reduced by this configuration.

Furthermore, the attenuator circuits disclosed in the Gilbert '541 and '478 patents apparently can not be used as simple attenuators; that is, they must be utilized as a feedback component of an amplifier.

It would be desirable to provide a logarithmic attenuator circuit which can be utilized as a simple attenuator otherwise than as a feedback component of an amplifier. It also would be desirable to provide a logarithmic attenuator circuit which is more readily implemented in an integrated circuit using CMOS technology than the logarithmic amplifiers disclosed in the Gilbert '541 and '478 patents.

SUMMARY OF THE INVENTION

Accordingly, it is an object of the invention to provide a low cost logarithmic attenuator or amplifier.

It is another object of the invention to provide a logarithmic attenuator or amplifier which is readily implemented as an integrated circuit using CMOS technology.

It is another object of the invention to provide a highly linear integrated circuit logarithmic amplifier.

It is another object of the invention to provide a low cost, highly accurate system for providing amplification in which the gain in dB is a linear function of a gain control signal.

It is another object of the invention to provide a low cost logarithmic gain circuit which reduces the effect of noise, such as common mode noise generated in the substrate of an integrated circuit structure incorporating the gain circuit or produced by power supply voltages applied thereto.

Briefly described, and in accordance with one embodiment thereof, the invention provides a technique for obtaining logarithmic gain by providing a resistive attenuator (8A) including an input conductor (7) and an output conductor (10), a plurality of series resistive elements (28) connected in series between the input conductor (7A) and the output conductor (10A), and a plurality of parallel resistive elements (29) each having a first terminal connected to a successive junction, respectively, between the various series resistive elements (28), each of the parallel resistive elements including an electrically controllable resistive element having a control terminal operative to control the resistance thereof, each of the parallel resistive elements including a second terminal coupled to a common conductor, and producing a plurality of successive piecewise-linear control signals (V1,2 . . . 10) on the control terminals of successive electrically controllable resistive elements, respectively. The plurality of successive piecewise linear control signals are produced in response to linear changing of a gain control signal ($V_{GC}$) from a first value to a second value. In one described embodiment, a logarithmic amplifier includes an operational amplifier having an inverting input, a non-inverting input, and an output, a logarithmic attenuator having an input coupled to the output of the operational amplifier and an output coupled to the inverting input of the operational amplifier, the logarithmic attenuator including a resistive attenuator (8A) including an input conductor (7) and an output conductor (10), a plurality of series resistive elements (28) connected in series between the input conductor (7A) and the output conductor (10A), and a plurality of parallel resistive elements (29) each having a first terminal connected to a successive junction, respectively, between the various series resistive elements (28), each of the parallel resistive elements including an electrically controllable resistive element having a control terminal operative to control the resistance thereof, each of the parallel resistive elements including a second terminal coupled to a common conductor and a control circuit (8B) producing a plurality of successive piecewise-linear control signals (V1,2 . . . 10) on the control terminals of successive electrically controllable resistive elements, respectively, in response to changing of a gain control signal ($V_{GC}$) from a first value to a second value. In another described embodiment, a logarithmic attenuator circuit (8) includes a resistive attenuator (8A) including an input conductor (7) and an output conductor (10), a plurality of series resistive elements (28) connected in series between the input conductor (7A) and the output conductor (10A), and a plurality of parallel resistive elements (29) each having a first terminal connected to a successive junction, respectively, between the various series resistive elements (28), a plurality of switching elements (29) operative to controllably couple the parallel resistive elements (29), respectively, between the successive junctions and a first reference voltage conductor (40), each switching element (29) having a control terminal, and a control circuit (8B) producing a plurality of successive increasing control signals (V1,2 . . . 10) which then level off on the control terminals of successive switches, respectively, in response to linear changing of a gain control signal ($V_{GC}$) from a first value to a second value. Each series resistive element includes a MOSFET having its gate connected to a second reference voltage conductor (GND). Each parallel resistive element includes a channel region in a MOSFET that also functions as the switching element coupling the parallel resistive element between a corresponding junction and the first reference voltage conductor. The control circuit (8B) includes a plurality of differential amplifiers (21) each having a first input coupled to receive a gain control signal ($V_{GC}$) on a gain control conductor 9 and a second input, and a circuit (60) producing a plurality of successive threshold voltages ($V_{T1,2 . . . 10}$) each having a larger magnitude than the previous one, the second inputs being coupled to receive the plurality of threshold voltages, respectively.

BRIEF DESCRIPTION OF THE DRAWINGS

FIG. 1 is a block diagram of a system for digitizing data produced by a CCD imaging device and including a logarithmic attenuator.

FIG. 2 is a detailed block diagram of the logarithmic attenuator of block 8 of FIG. 1.

FIG. 2A is a schematic diagram of a circuit for generating the voltages $V_{T1,2 . . . 10}$ shown in FIG. 2.

DETAILED DESCRIPTION OF THE PREFERRED EMBODIMENT

By way of definition, the terms "logarithmic attenuator" and "logarithmic amplifier" as used herein mean that the gain of the attenuator or amplifier is logarithmic with respect to a gain control input signal applied thereto. Stated differently, the gain expressed in decibels is a linear function of the gain control signal. Also by way of definition, the term "gain" as used herein can refer to a ratio of an output signal to an input signal wherein the magnitude of such gain can be either greater or less than one, and therefore the term can apply to either an attenuator or an amplifier. Further by way of definition, a MOSFET (metal oxide semiconductor field effect transistor) can function as a voltage controlled switch and/or as a voltage controlled resistor, so it is intended that a particular MOSFET can function as either and/or both. Also, a MOSFET which is biased just at the "edge" of conduction (so its gate-to-source voltage is equal to its threshold voltage) is considered to be "off", and when the magnitude of its gate-to-source voltage is increased above its threshold voltage it is considered to be "on".

Figure 3:
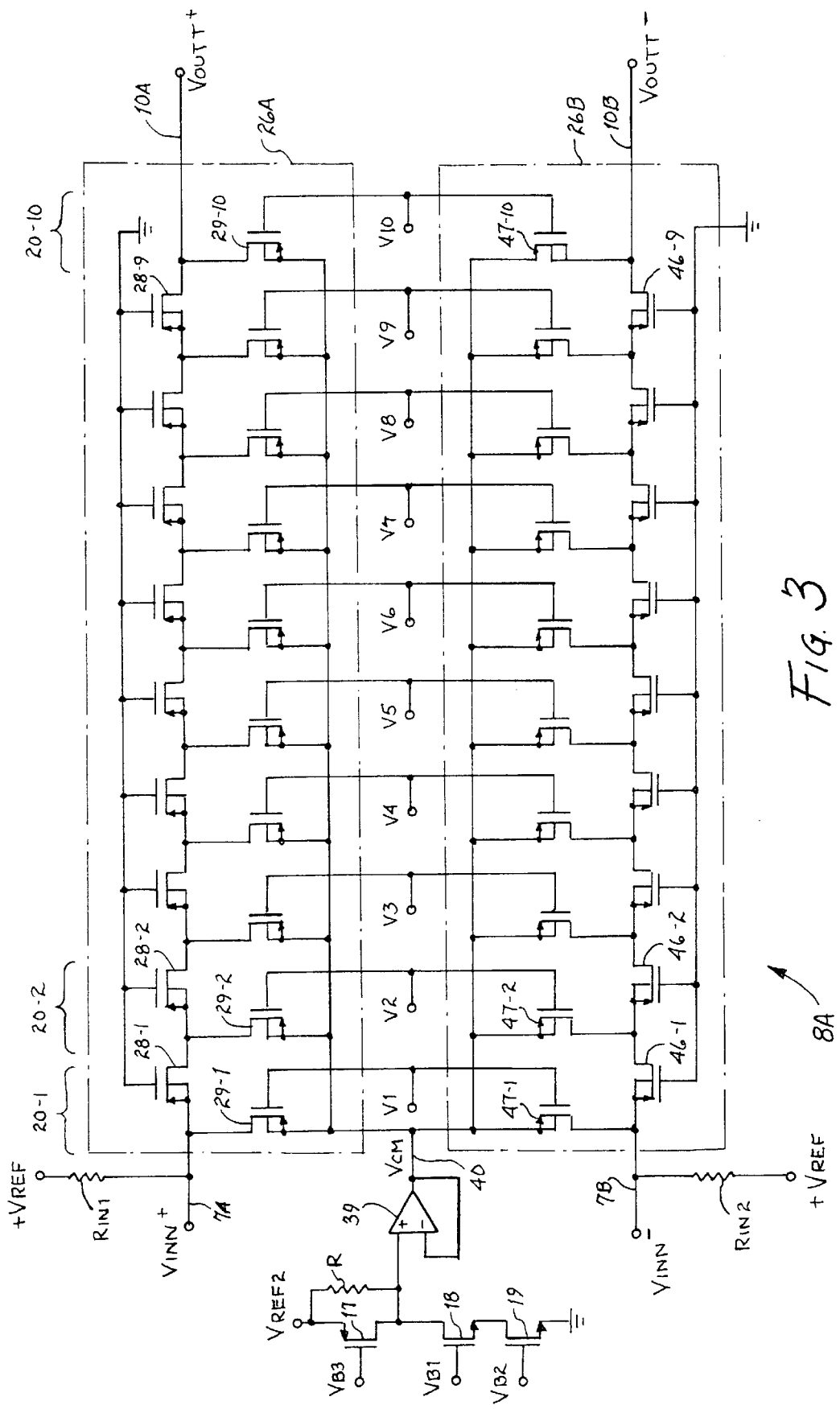
FIG. 3 is a schematic circuit diagram of a resistive portion 8A of the logarithmic attenuator shown in block 8 of FIG. 2.
Figure 6:
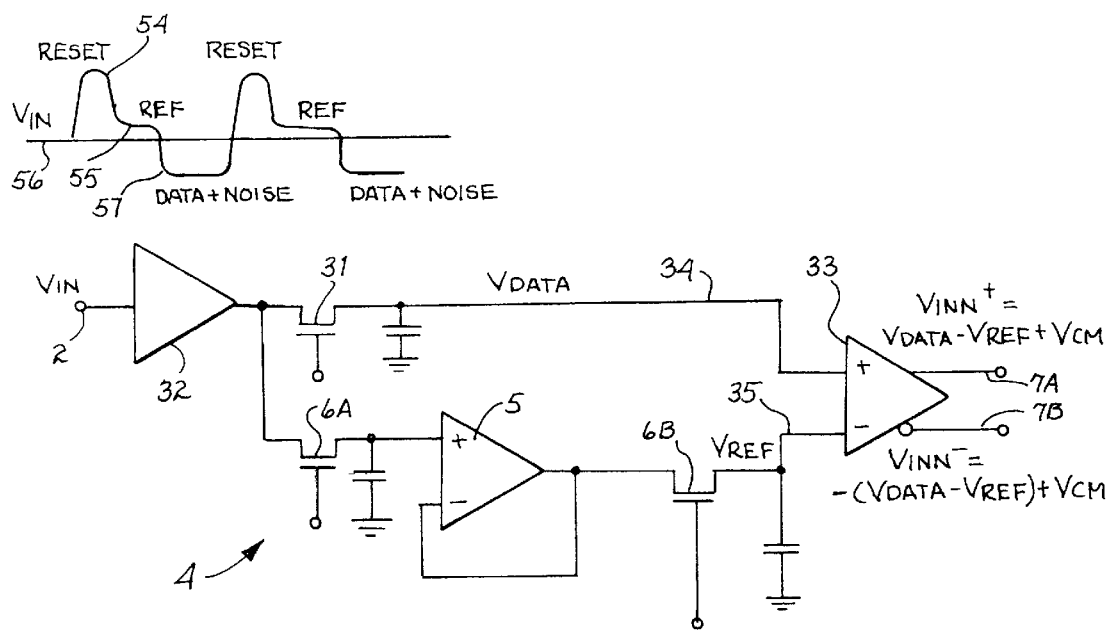
FIG. 6 is a schematic diagram of the correlated double sampler circuit 4 in FIG. 1.

Referring to FIG. 1, system 1 digitizes the analog output signal $V_{IN}$ produced by a CCD imaging array 3. $V_{IN}$, which has a waveform shape shown in FIG. 6, is applied as a single-ended analog input to an input conductor 2 of a correlated double sampler circuit 4. Correlated double sampler circuit 4 produces a differential output represented by the expression $V_{INN}=V_{INN}^+-V_{INN}^-$. In FIGS. 1 and 2 the conductors carrying $V_{INN}$ are collectively designated by numeral 7. In FIGS. 3 and 6 $V_{INN}^+$ and $V_{INN}^-$ appear on input conductors 7A and 7B, respectively, of a differential logarithmic attenuator 8. A "dummy" feedback clamp circuit 5 shown in FIG. 1 is coupled between one of the conductors 7A and 7B and input conductor 2 by means of a sample and hold circuit 6 to compensate for any input offset voltage of correlated double sampler circuit 4.

Figure 8:
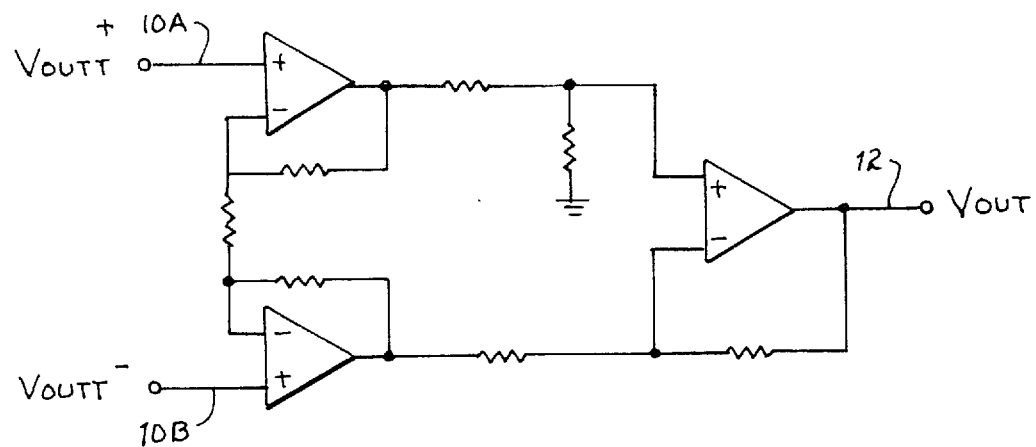
FIG. 8 is a schematic diagram of the amplifier 11 of FIG. 1.

Differential logarithmic attenuator 8 produces a differential output signal $V_{OUTT}=V_{OUTT}^+-V_{OUTT}^-$. In FIGS. 1 and 2 $V_{OUTT}$ is shown as being carried by conductors which are collectively designated by numeral 10. In FIGS. 3 and 8 $V_{OUTT}^+$ is shown as being produced on conductor 10A and $V_{OUTT}^-$ is produced on conductor 10B. $V_{OUTT}$ is applied to the inputs of a 25X differential-to-single-ended amplifier 11. Amplifier 11 produces its single-ended output voltage $V_{OUT}$ on conductor 12, which is connected to the input of a fast 10 bit analog-to-digital converter 15. Analog-to-digital converter 15 produces a 10 bit signal output DIGITAL OUT which accurately represents the input voltage $V_{IN}$ for each pixel of CCD imaging array 3.

It is important that the system of FIG. 1 allow the gain or attenuation between the output of CCD imaging array 3 and the digital output of analog-to-digital converter 15 to be controlled in a logarithmic fashion, so that the attenuation or gain in decibels (dB) is linearly proportional to $V_{GC}$. The gain in decibels is set by adjusting a gain control voltage $V_{GC}$ applied by conductor 9 to a gain control input of differential logarithmic attenuator circuit 8.

A "black feedback clamp" circuit 13 is coupled between conductor 12 and the differential input of amplifier 11 by a sample and hold circuit 14. It performs the function of clamping the output to a signal level that corresponds to a "black" image on a monitor.

The differential configuration of the resistive portion 8A of logarithmic attenuator 8 shown in FIG. 3 was chosen to improve signal linearity. Such improved linearity results because the differential configuration tends to cancel second harmonic distortion. The differential configuration also provides good common mode noise rejection.

Referring to FIG. 2, differential logarithmic attenuator circuit 8 includes the resistive section 8A including ten attenuator sections 20-1, 2 . . . 10 connected in a cascaded (i.e., series) configuration. (Note that the ten attenuator sections 20-1,2 . . . 10 of FIG. 2 are indicated by brackets in FIG. 3.) The differential input signal $V_{INN}=V_{INN}^+-V_{INN}^-$ is applied between the differential inputs 7A and 7B of the first section 20-1, as also shown in FIG. 3. The differential output voltage $V_{OUTT}=V_{OUTT}^+-V_{OUTT}^-$ is produced at the output of the last section 20-10 between conductors 10A and 10B. Referring to FIG. 3, differential attenuator 8A includes an upper portion 26A shown within dashed lines and an identical lower portion 26B also shown within dashed lines. Upper portion 26A includes nine "series" P-channel MOSFETs 28-1,2 . . . 9 connected as the series components. The gate electrodes of all of the series MOSFETs 28-1,2 . . . 9 and 46-1,2 . . . 9 are connected to ground. Ten "parallel" P-channel MOSFETs 29-1,2 . . . 10 are connected as the parallel components connected to the successive junctions of source and drain conductors of the series MOSFETs 28-1,2 . . . 9, respectively. The source of MOSFET 28-1 receives $V_{INN}^+$ on conductor 7A. An input resistor $R_{IN1}$ is connected between conductor 7A and $+V_{REF}$, which can be 2.4 volts. The drain of MOSFET 28-9 is connected to conductor 10A to produce an attenuated output signal $V_{OUTT}^+$ thereon.

Similarly, the identical lower portion 26B of resistive differential attenuator section 8A includes nine series P-channel MOSFETs 46-1,2 . . . 9 connected in series as shown between $V_{INN}^-$ on conductor 7B and $V_{OUTT}^-$ on 10B. Lower section 26B also includes ten parallel P-channel MOSFETs 27-1,2 . . . 10 connected as shown to the successive junctions of sources and drains of the series MOSFETs 46-1,2 . . . 9. Resistor $R_{IN2}$, which is identical to resistor $R_{IN1}$, is connected between conductor 7B and $+V_{REF}$. The geometries of the above MOSFETs are selected so that when they all are fully turned on an accurate ladder network is formed.

All of the P-channel MOSFETs shown in FIG. 3 have their N-type "body" electrodes connected to their respective source electrodes, to prevent source-to-body reverse bias voltage in the P-channel MOSFETs and thereby also prevent non-linear "body effect" on the threshold voltages of such P-channel MOSFETs. (If N-channel MOSFETs were used in a typical CMOS integrated circuit, it would be impractical to connect their sources to their body electrodes.)

Still referring to FIG. 3, the source electrodes of all of the parallel MOSFETs 29-1,2 . . . 10 and 47-1,2 . . . 10 are connected by a single conductor 40 to receive the common mode voltage $V_{CM}$ produced by a differential amplifier 39 having its inverting input connected to conductor 40 and its non-inverting input to the drain of a P-channel MOSFET 17, the drain of an N-channel MOSFET 18 and to one terminal of a resistor R. The other terminal of resistor R and the source electrode of MOSFET 17 are connected to a reference voltage $V_{REF2}$, which can be 2.4 volts. The source of MOSFET 18 is connected to the drain of an N-channel MOSFET 19, the source of which is connected to ground. If $V_{REF2}$ is 3.0 volts, suitable bias voltages $V_{B1}$, $V_{B2}$, and $V_{B3}$ (preferably having values of approximately 1.5, 0.8 and 2.0 volts, respectively) are applied to the gate electrodes of MOSFETs 18, 19, and 17, respectively. The geometries of MOSFETs 17, 18, and 19 and the resistance of resistor R are chosen to provide a value of common mode voltage $V_{CM}$ which optimizes the dynamic range of the piecewise-linear control voltages V1, V2 . . . V10 applied to the gate electrodes of the parallel MOSFETs in sections 20-1,2 . . . 10, respectively, as shown. A suitable value of $V_{CM}$ is 1.8 volts.

Referring again to FIGS. 2 and 3 the "piecewise-linear" control voltages V1,2 . . . 10 applied to the gate electrodes of the "parallel" MOSFETs 29 and 47 are generated at the outputs of differential amplifiers 21-1,2 . . . 10, respectively, which are included in the control portion 8B of attenuator 8. The inverting inputs of differential amplifiers 21-1,2 . . . 10 are connected to successively increasing threshold voltages $V_{T1,2 \ldots 10}$, respectively. These threshold voltages are generated by the resistive divider circuit 60 shown in FIG. 2A. Circuit 60 is connected between a reference voltage $+V_{REF}$, producing a current that develops equal voltages of approximately 120 millivolts across each of the equal series-connected resistors 61. The non-inverting inputs of each of the differential amplifiers is connected to gain control conductor 9 to which the gain control voltage $V_{GC}$ is applied.

Figure 4:
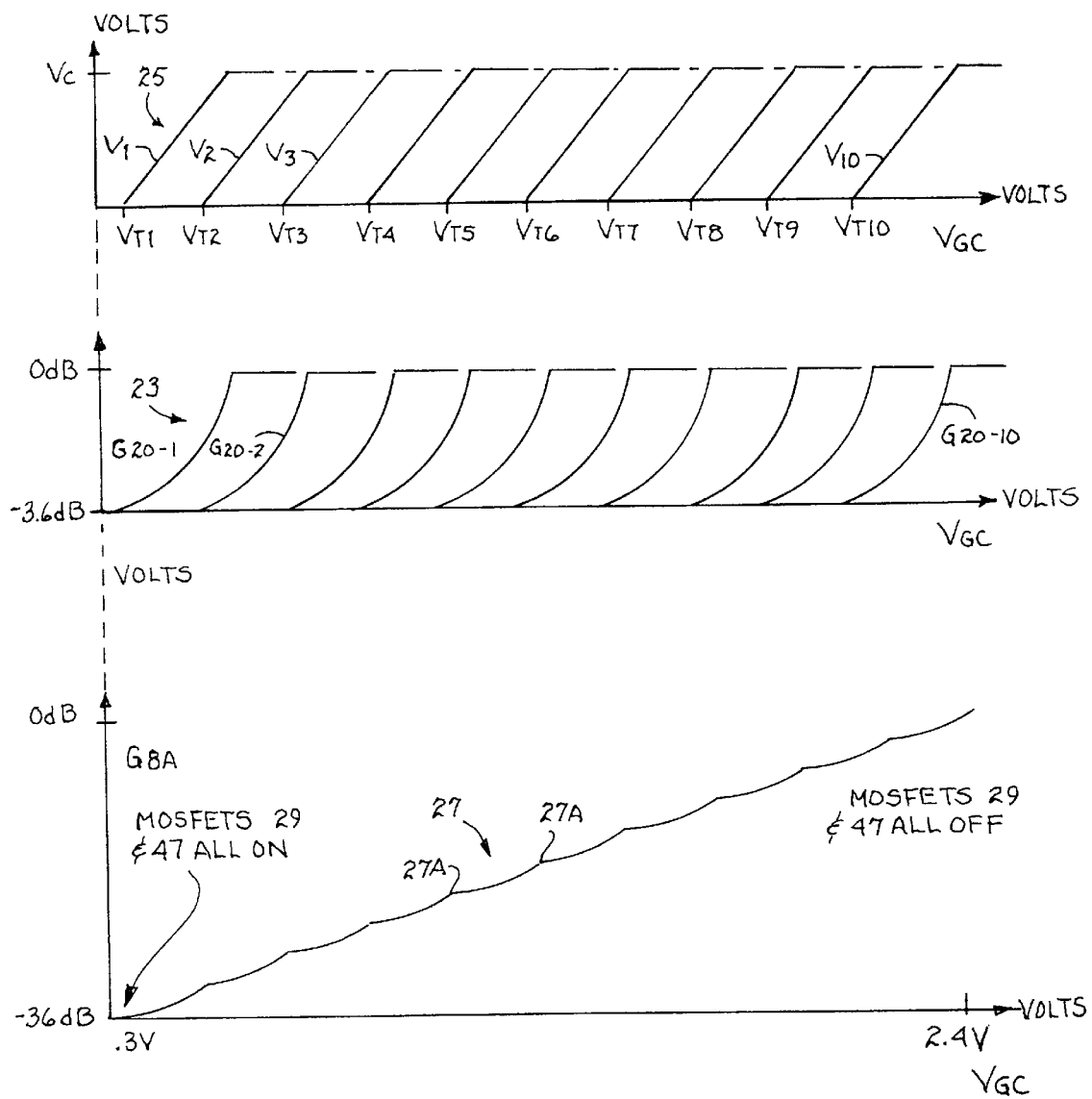
FIG. 4 is a diagram showing the gains in decibels of the individual attenuator stages, respectively, and the total attenuator gain as a function of the gain control input voltage for the logarithmic attenuator of FIGS. 2 and 3.

In FIG. 4 the curves designated by numeral 25 show how each of the piecewise-linear individual attenuator section control voltages V1, V2 . . . 10 increases from zero to $+V_C$ volts and then levels off at $V_C$ volts as the gain control voltage $V_{GC}$ is increased to first equal and then to exceed the threshold voltages $V_{T1,2 \ldots 10}$, respectively. Curves 23 in FIG. 4 illustrate the non-logarithmic responses (in decibels) of each of the stages 20-1,2 . . . 10 as the parallel MOSFETs of stages 20-1,2 . . . 10 are successively turned off by increasing $V_{GC}$. The gain (i.e., attenuation) of each of such attenuator sections 20 increases from −3.6 dB to 0 dB as its control voltage V1,2 . . . 10 gradually increases from zero volts to $+V_C$ volts, which can be 1.2 volts. This causes the total gain (attenuation) of attenuator 8 to have the composite logarithmic gain indicated by curve 27 in FIG. 4, increasing from −36 dB with $V_{GC}$ at 0.3 volts to 0 dB when $V_{GC}$ is at +2.4 volts. Overlapping of the individual gain curves G20-1,2 . . .10 in response to the individual differential amplifier output signals V1,2 . . . 10 (curves 25 in FIG. 4) results in a generally linear, but slightly "scalloped" appearance with successive "cusps" 27A.

The reason that the attenuator 8 produces the logarithmic gain with respect to the gain control voltage $V_{GC}$ perhaps can be best understood from the following explanation of the theory of operation of attenuator 8. First, note that if a function can be produced having the form of $$A=R^{(V_{GC}/V_N)}, \quad \text{Eq. (1)}$$

then taking the logarithm of Eq. (1), multiplying both sides of the resulting expression by 20, and simplifying terms results in $$20\log_{10}(A) = 20\log_{10}(R)\left(\frac{V_{GC}}{V_N}\right), \qquad \text{Eq. (2)}$$

which can be simplified to $$A(\text{in dB}) = K \cdot V_{GC}, \qquad \text{Eq. (3)}$$

where K is a constant.

Next, it can be shown that the channel resistance of a MOSFET which is turned on in its "triode" or "non-saturated" region is now $$R_{ON} = \frac{1}{2\mu C_{ox}(W/L)(V_{SG} - V_T)}, \qquad \text{Eq. (4)}$$

where $V_{SG}$ is the source-to-gate voltage of the MOSFET, $V_T$ is its threshold voltage, W is its channel width, L is its channel length, and the term $2\mu C_{OX}$ is a constant.

If the resistance of a "series" MOSFET (such as MOSFET 28-1 in FIG. 3) is Rs and the resistance of a corresponding "parallel" MOSFET such as 29-1 is Rp, then the attenuation $A_i$ of a section of the attenuator formed by those two resistors is $$Ai = \frac{R_{Pi}}{R_{Pi} + R_{Si}}. \qquad \text{Eq. (5)}$$

Substituting Eq. (4) into Eq. (5) for $Rp_i$ and $Rs_i$ results in $$Ai = \frac{1}{1 + \left(\dfrac{W_c}{W_c}\right)\left(\dfrac{V_{GSp} - V_T}{V_{SGs} - V_T}\right)} \qquad \text{Eq. (6)}$$

for the sections each of attenuator stages 20-1,2 ... 10 in upper portions 26A.

Although the total gain (attenuation) of the ten cascaded sections 20-1,2 ... 10 of attenuator 8A, with all of the MOSFETs turned on simultaneously, can be provided in a mathematical expression, that expression is not a logarithmic function that would allow the composite attenuator gain to be expressed in decibels as a linear function of the gain control voltage $V_{GC}$, which is equal to $V_{SGp}$ in Eq. (6).

However, in accordance with the present invention, if the parallel MOSFETs 29-1,2 ... 10 are periodically turned on in sequence and then left on as the following ones are successively turned on (as shown by the differential amplifier output curves 25 in FIG. 4), then the "sampled" composite gain of attenuator 8A can be thought of as having the form $$A_{COMPOSITE} = A_i^{(N1+N2+\ldots+N10)} \qquad \text{Eq. (7)}$$

Then the exponent shown in Eq. (7) can be thought of as the "sampled" version of the linear exponent shown in Eq. (1). This gives rise to an attenuation control function that is stepped and would appear similar to the stepped transfer characteristic of a digital-to-analog converter. A closer approximation to the true linear logarithmic characteristic could be obtained by increasing the number of attenuator sections. I have found that providing the voltage on the gate of each of the parallel MOSFETs in such a manner that it varies linearly with the gain control signal $V_{GC}$, rather than providing stepwise variation thereof, results in smoothing of the attenuation control characteristic and results in the above described linear characteristic curve 27 shown in FIG. 4, if the threshold voltages $V_{T1,2 \ldots 10}$ are spaced as shown so that each of the differential amplifier output voltages V1,2 ... 10 overlaps the next.

Figure 5:
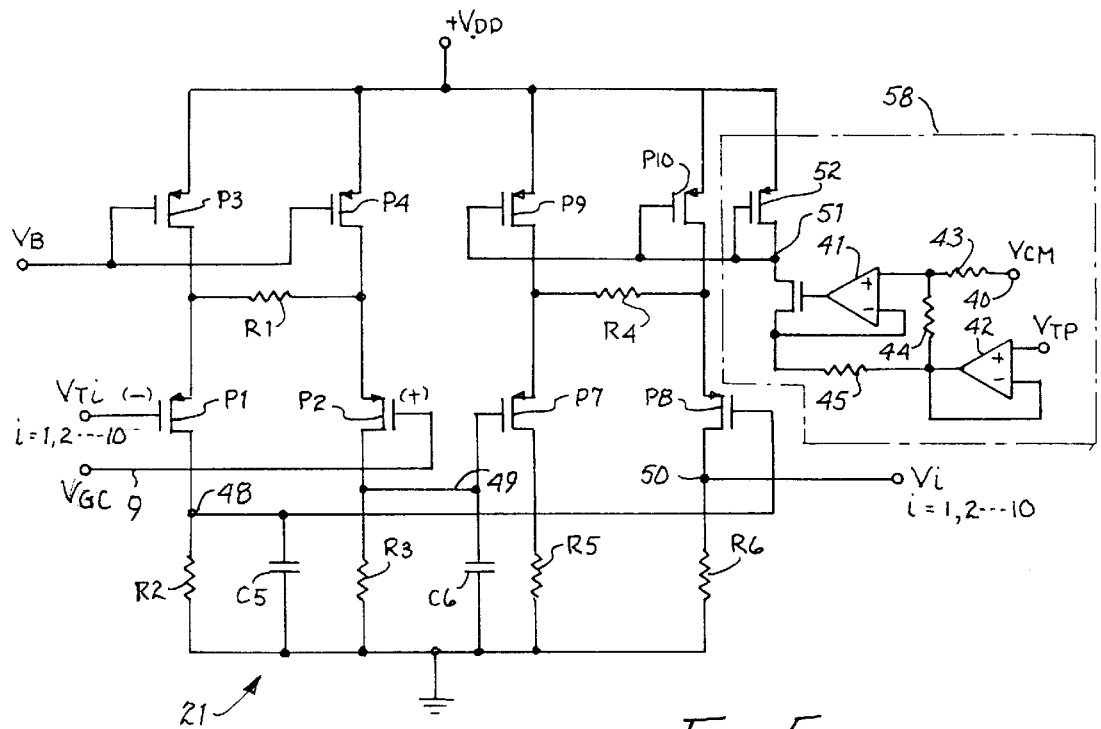
FIG. 5 is a schematic diagram of one of the differential amplifiers 21 shown in FIG. 2.

The configuration of differential amplifiers 21-1,2 ... 10, which is fairly conventional, is shown in FIG. 5. Differential amplifier 21 in FIG. 5 has a first differential stage including P-channel MOSFETs P1 and P2, P-channel current source MOSFETs P3 and P4 coupled between $+V_{DD}$ and the sources of MOSFETs P1 and P2, respectively, and load resistors R2 and R3 connected between the drains of input MOSFETs P1 and P2 and ground as shown. A resistor R1 is coupled between the sources of MOSFETs P1 and P2 to perform the function of setting the gain of differential amplifier 21. A bias voltage $V_B$ of approximately 2.0 volts is applied to the gate electrodes of current source MOSFETs P3 and P4 to provide the desired bias currents. $V_{Ti}$ can be any of the threshold voltages $V_{T1,2 \ldots 10}$ of FIG. 2 applied to the inverting (−) input of differential amplifier 21 connected to the gate of MOSFET P1. The gain control voltage VGC is applied to the (+) input connected to the gate of MOSFET P2.

A second differential stage of differential amplifier 21 includes P-channel input MOSFETS P7 and P8. The second differential stage has a configuration identical to the first differential stage, with current source P-channel MOSFETs P9 and P10 being biased by a voltage on conductor 51 to provide the needed bias current. Load resistors R5 and R6 are coupled between ground and the drain electrodes of input MOSFETs P7 and P8, respectively. A single-ended output voltage Vi is produced on output conductor 50, which connects resistor R6 to the drain of MOSFET P8. The gate of MOSFET P7 is connected by conductor 49 to the junction of the drain of MOSFET P2 and load resistor R3. The gate of MOSFET P8 is connected by conductor 48 to the junction of the drain of MOSFET P1 and load resistor R2. Capacitors C5 and C6 are connected between ground and first stage output conductors 48 and 49 to limit the bandwidth of differential amplifier 21.

A bias circuit 58 including differential amplifiers 41 and 42, P-channel MOSFET 52, N-channel MOSFET 53, and resistors 43, 44 and 45 produces a bias voltage on conductor 51 which varies as a function of the threshold voltage $V_{TP}$ of the P-channel MOSFETs of the integrated circuit on which the logarithmic attenuator 8 is formed.

The operation of each of the differential amplifiers is such that its output voltage Vi maintains both of the parallel MOSFETs 29-i and 47-i just at the edge of conduction after $V_{GS}$ exceeds the threshold voltage $V_{Ti}$ applied to that differential amplifier. Until $V_{GC}$ increases past that threshold voltage, the output Vi increases linearly, as indicated by curves V1,2 ... 10 as shown by the curves 25 in FIG. 4.

Figure 7:
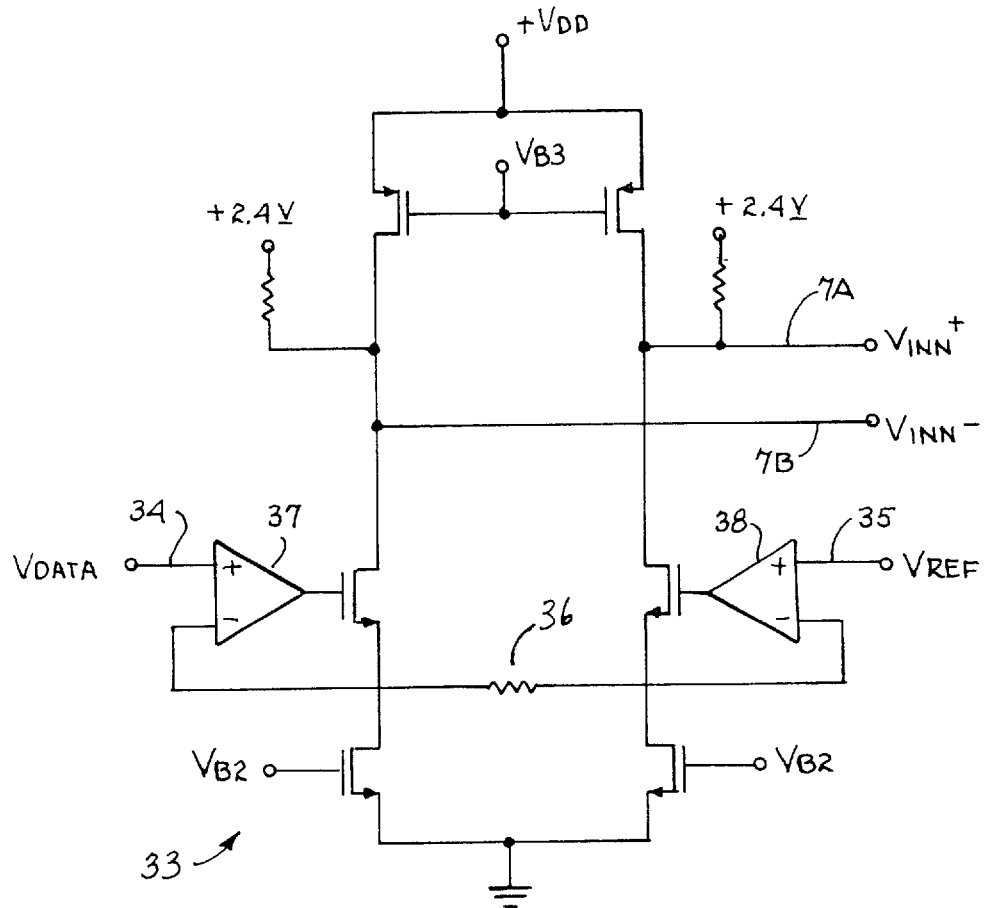
FIG. 7 is a schematic diagram of the difference amplifier 33 in the diagram of FIG. 6.

FIG. 6 shows the conventional correlated double sampler circuit 4 of FIG. 1 which is used to eliminate the effect of cumulative noise in the $V_{IN}$ signal produced by CCD array 3. The signal $V_{IN}$ includes, for each pixel of CCD array 3, a RESET pulse 54 that rises above a "zero" level 56, and then falls to a level 55 during a "reference" interval. Level 56 may be above or below the "zero" level 56, and constitutes noise that occurs because each pixel of CCD array 3 is slightly different from the others. This difference manifests itself as noise in the output voltage $V_{IN}$ applied to the input of correlated double sampler circuit 4. The $V_{IN}$ signal for each pixel also includes a negative pulse 57 that includes data information plus the same (i.e., "correlated") noise represented by level 55. The correlated double sampler circuit of FIG. 6 operates to sample both the level 55 and the level 57 and produce the output signal $V_{INN} = V_{INN}^+ - V_{INN}^-$ which cancels the noise represented by level 55 and also converts single-ended input signal $V_{IN}$ to a differential signal centered about the common mode voltage $V_{CM}$. The dummy feedback clamp circuit 5 of FIG. 1 is used to eliminate the effect of any input offset voltage of differential amplifier 33 of FIG. 6 to thereby prevent amplifier 11 of FIG. 1 from "gaining up" input offset voltage associated with correlated double sampler circuit 4. During level 55 of the $V_{IN}$ waveform a signal is applied to the gate of MOSFET 6A to turn it on in order to sample level 55. During level 57 a signal is applied to the gates of MOSFETs 31 and 6B to turn them on to accomplish sampling of level 57. FIG. 7 is a schematic diagram of the difference amplifier 33 shown in FIG. 6.

FIG. 8 shows a conventional differential-to-single-ended amplifier 11 of FIG. 1, receiving the differential input signals $V_{OUT}^+$ and $V_{OUT}^-$ on conductors 10A and 10B to produce the single-ended output voltage $V_{OUT}$ on conductor 12.

Figure 9:
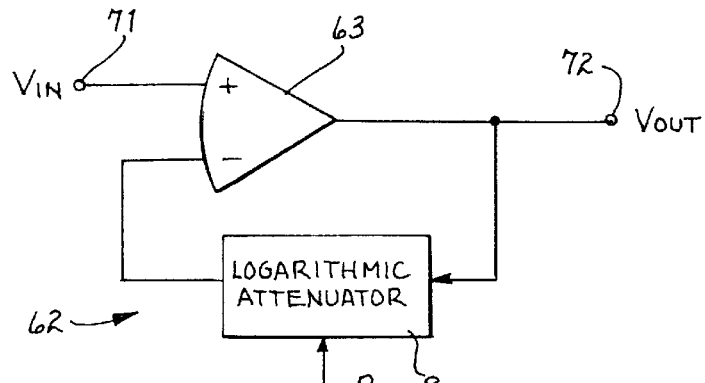
FIG. 9 is a block diagram of a logarithmic amplifier embodiment of the present invention.

FIG. 9 shows an important practical application of the logarithmic attenuator 8, connected as a feedback element between the output and the inverting input of an operational amplifier 63 to provide a logarithmic amplifier 62.

Figure 10:
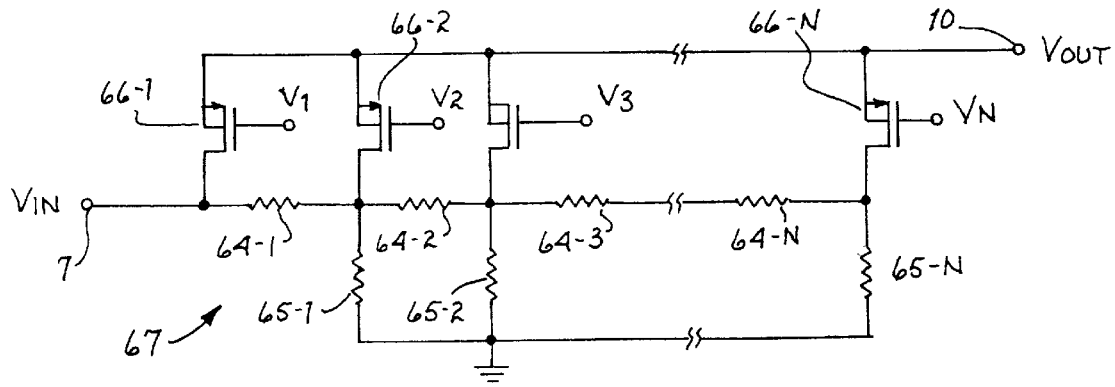
FIG. 10 is a schematic diagram of an alternative logarithmic attenuator structure of the present invention.

FIG. 10 shows an alternate embodiment of a logarithmic attenuator 67, in which the series resistive elements 64-1,2 ... N are shown as resistors, although they could be MOSFETs biased as resistors as shown in FIG. 3. The parallel resistive elements 65-1,2 ... N also are shown as resistors coupled between the various junctions of the series resistive elements and a reference voltage conductor. A plurality of P-channel MOSFETs 66-1,2 ... N are connected between an output conductor 10 and the successive junction nodes, respectively, of the series resistive elements 64-1,2 ... N. Although this resistive attenuator structure 67 would not be as linear as the attenuator structure of FIG. 3, it nevertheless would have a logarithmic gain characteristic if the gate electrodes of the MOSFET 66-1,2 ... N are driven by the control circuit shown in FIG. 3.

Figure 11:
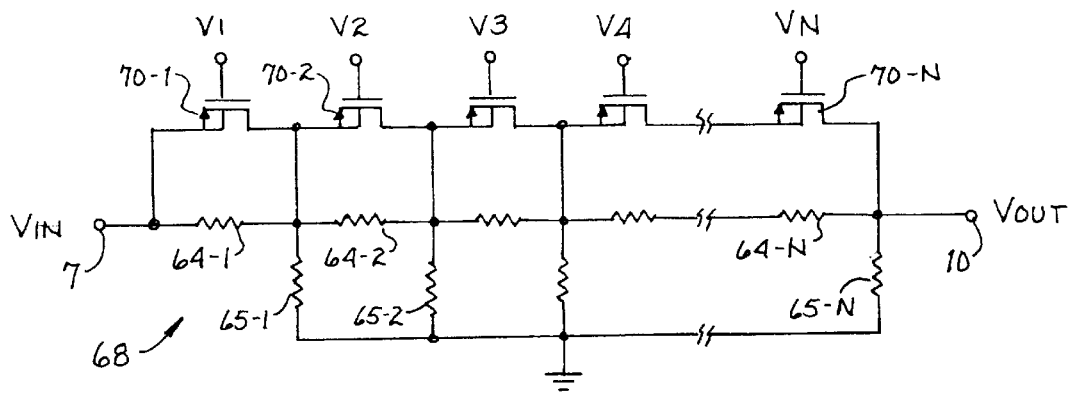
FIG. 11 is a schematic diagram of another alternative logarithmic attenuator structure of the present invention.

Similarly, another attenuator structure 68 shown in FIG. 11 similarly would be less linear than the attenuator structure shown in FIG. 3, but it would have a logarithmic gain characteristic if the gate electrodes of the MOSFETs 70-1,2 ... N are driven by the control circuit 8B of FIG. 3. In FIG. 11, each of the MOSFET switches 70-1,2 ... N is coupled across a corresponding series resistive element 64-1,2 ... N.

While the invention has been described with reference to several particular embodiments thereof, those skilled in the art will be able to make the various modifications to the described embodiments of the invention without departing from the true spirit and scope of the invention. It is intended that all elements and steps which are insubstantially different or perform substantially the same function in substantially the same way to achieve the same result as what is claimed are within the scope of the invention.

For example, in the attenuators shown in FIGS. 10 and 11, if the voltages V1, V2 ... $V_N$ increase from zero to $+V_C$ volts, level off at $V_C$ volts, and then decrease from $V_C$ volts back to zero volts in generally the same manner as in the Gilbert '541 and '478 patents for each stage of the resistive attenuator circuit, a logarithmic composite transfer function would be achieved. However, providing the CMOS switches as shown in FIG. 3 provides greater linearity for the same number of stages of the resistive attenuator circuit.

What is claimed is:

1. A logarithmic attenuator circuit comprising:
   (a) a resistive attenuator including
      i. an input conductor and an output conductor,
      ii. a plurality of series resistive elements connected in series between the input conductor and the output conductor, and
      iii. a plurality of parallel resistive elements each having a first terminal connected to a successive junction, respectively, between the various series resistive elements;
   (b) a plurality of switching elements operative to controllably couple the parallel resistive elements, respectively, between the successive junctions and a first reference voltage conductor, each switching element having a control terminal; and
   (c) a control circuit producing a plurality of successive gradually increasing and then leveling off analog control signals on the control terminals of successive switching elements, respectively, in response to gradual linear changing of an analog gain control signal from a first value to a second value.

2. The logarithmic attenuator circuit of claim 1 wherein each series resistive element includes a MOSFET having its gate connected to a second reference voltage conductor.

3. The logarithmic attenuator circuit of claim 1 wherein each parallel resistive element includes a MOSFET that also functions as the switching element coupling the parallel resistive element between a corresponding junction and the first reference voltage conductor.

4. The logarithmic attenuator of claim 2 wherein each parallel resistive element includes a MOSFET that also functions as the switching element coupling the parallel resistive element between a corresponding junction and the first reference voltage conductor.

5. The logarithmic attenuator of claim 1 wherein the control circuit includes a plurality of differential amplifiers each having a first input coupled to receive a gain control signal on a gain control conductor and a second input, and a circuit producing a plurality of successive threshold voltages each having a larger magnitude than the previous one, the second inputs being coupled to receive the plurality of threshold voltages, respectively.

6. The logarithmic attenuator of claim 4 wherein the control circuit includes a plurality of differential amplifiers each having a first input coupled to receive a gain control signal on a gain control conductor and a second input, and a circuit producing a plurality of successive threshold voltages each having a larger magnitude than the previous one, the second inputs being coupled to receive the plurality of threshold voltages, respectively.

7. The logarithmic attenuator of claim 6 wherein each differential amplifier includes an output stage bias control circuit that maintains an output of that differential amplifier at a voltage approximately equal to a threshold voltage of a MOSFET functioning as a parallel resistive element and as a switching element if the magnitude of the gain control voltage is less than or equal to the magnitude of the threshold voltage applied to the second input of the differential amplifier.

8. The logarithmic amplifier of claim 4 wherein all of the MOSFETs are P-channel MOSFETs each having its source electrode connected to its body electrode.

9. A logarithmic gain circuit comprising:
   (a) a resistive attenuator including
      i. an input conductor and an output conductor,
      ii. a plurality of series resistive elements connected in series between the input conductor and the output conductor, and
      iii. a plurality of parallel resistive elements each having a first terminal connected to a successive junction, respectively, between the various series resistive elements;
   (b) a plurality of switching elements operative to controllably electrically couple the parallel resistive elements, respectively, between the successive junctions and a first reference voltage conductor, each switching element having a control terminal; and (c) an analog control circuit producing a plurality of successive control signals on the control terminals of successive switching elements, respectively, in response to linear changing of an analog gain control signal from a first value to a second value, a magnitude of each control signal gradually increasing and then leveling off at a predetermined value.

10. A logarithmic gain circuit comprising:

(a) a resistive attenuator including
  i. an input conductor and an output conductor,
  ii. a plurality of series resistive elements connected in series between the input conductor and the output conductor, and
  iii. a plurality of parallel resistive elements each having a first terminal connected to a successive junction, respectively, between the various series resistive elements, each of the parallel resistive elements including an electrically controllable resistive element having a control terminal operative to control the resistance thereof, each of the parallel lyresistive elements including a second terminal coupled to a common conductor; and (b) an analog control circuit producing a plurality of successive piecewise-linear gradually changing analog control voltage signals on the control terminals of successive electrically controllable resistive elements, respectively, in response to gradual changing of an analog gain control signal from a first value to a second value.

11. A logarithmic amplifier comprising:

(a) an operational amplifier having an inverting input, a non-inverting input, and an output;

(b) a logarithmic attenuator having an input coupled to the output of the operational amplifier and an output coupled to the inverting input of the operational amplifier, the logarithmic attenuator including
  (1) a resistive attenuator including
    i. an input conductor and an output conductor,
    ii. a plurality of series resistive elements connected in series between the input conductor and the output conductor, and
    iii. a plurality of parallel resistive elements each having a first terminal connected to a successive junction, respectively, between the various series resistive elements, each of the parallel resistive elements including an electrically controllable resistive element having a control terminal operative to control the resistance thereof, each of the parallel resistive elements including a second terminal coupled to a common conductor; and
  (2) an analog control circuit producing a plurality of successive piecewise-linear gradually changing analog control voltage signals on the control terminals of successive electrically controllable resistive elements, respectively, in response to gradual changing of an analog gain control signal from a first value to a second value.

12. A method of operating a circuit to provide a logarithmic gain, comprising:

(a) providing a resistive attenuator including an input conductor and an output conductor, a plurality of series resistive elements connected in series between the input conductor and the output conductor, and a plurality of parallel resistive elements each having a first terminal connected to a successive junction, respectively, between the various series resistive elements, each of the parallel resistive elements including an electrically controllable resistive element having a control terminal operative to control the resistance thereof, each of the parallel resistive elements including a second terminal coupled to a common conductor; and (b) producing a plurality of gradually changing successive piecewise-linear analog control voltage signals on the control terminals of successive electrically controllable resistive elements, respectively.

13. The method of claim 12 wherein step (b) includes producing the plurality of successive piece-wise linear analog control voltage signals in response to gradual linear changing of an analog gain control signal from a first value to a second value.

* * * * *